United States Patent
Cheng et al.

(10) Patent No.: US 8,692,618 B2
(45) Date of Patent: Apr. 8, 2014

(54) POSITIVE AND NEGATIVE VOLTAGE INPUT OPERATIONAL AMPLIFIER SET

(75) Inventors: Yen-Cheng Cheng, Hsinchu (TW); Hao-Yuan Zheng, Hsinchu (TW)

(73) Assignee: Orise Technology Co., Ltd., Hsinchu (TW)

( * ) Notice: Subject to any disclaimer, the term of this patent is extended or adjusted under 35 U.S.C. 154(b) by 41 days.

(21) Appl. No.: 13/611,213

(22) Filed: Sep. 12, 2012

(65) Prior Publication Data

US 2013/0093519 A1 Apr. 18, 2013

(30) Foreign Application Priority Data

Oct. 17, 2011 (TW) .............................. 100137591 A

(51) Int. Cl.
*H03F 3/45* (2006.01)

(52) U.S. Cl.
USPC .......................................................... 330/261

(58) Field of Classification Search
USPC .................................................. 330/252–261
See application file for complete search history.

(56) References Cited

U.S. PATENT DOCUMENTS 7,432,922 B2 * 10/2008 Chang et al. .................. 345/212

* cited by examiner

*Primary Examiner* — Hieu Nguyen
(74) *Attorney, Agent, or Firm* — WPAT, PC; Justin King

(57) ABSTRACT

A positive and negative voltage input operational amplifier includes a positive operational amplifier and a negative operational amplifier. Each of the positive operational amplifier and the negative operational amplifier has a reduced layout area and a lowered static current, so that the power consumption is effectively reduced.

11 Claims, 4 Drawing Sheets

POSITIVE AND NEGATIVE VOLTAGE INPUT OPERATIONAL AMPLIFIER SET

This application claims the benefit of Taiwan Patent Application No. 100137591, filed Oct. 17, 2011, the subject matter of which is incorporated herein by reference.

FIELD OF THE INVENTION

The present invention relates to an operational amplifier, and more particularly to a positive and negative voltage input operational amplifier of a source driver.

BACKGROUND OF THE INVENTION

FIG. 1 schematically illustrates the architecture of a conventional LCD panel. As shown in FIG. 1, the LCD panel comprises a gate driver 120, a source driver 110, and a thin film transistor array (TFT array) 100. The TFT array 100 comprises a plurality of pixel units P11~Pnn. The gate driver 120 is connected to a plurality of gate lines (not shown) of the TFT array 100. In addition, a plurality of gate pulses generated by the gate driver 120 are sequentially transmitted to the gate lines from top to bottom. In response to each gate pulse, a corresponding row of pixel units are turned on. Moreover, in response to each gate pulse, a plurality of source signals are generated by the source driver 110 according to an image signal (Data). Through a plurality of source lines of the TFT array 100, these source signals are transmitted to the pixel units which are turned on.

FIG. 2 is a schematic circuit block diagram illustrating the source driver of the conventional LCD panel. After the digital image signal (Data) is inputted into the source driver 110, the logic level of the image signal (Data) is changed by a level shifter 112. The image signal (Data) with the changed logic level is inputted into a digital-to-analog converter (DAC) 114. The digital-to-analog converter 114 issues a plurality of input signals to an output buffering unit 116. In response to the input signals, a plurality of source signals O1~On are generated by the output buffering unit 116 and transmitted to a plurality of source lines.

In the TFT array 100 of a specified LCD panel (e.g. a dot inversion LCD panel), the polarities of every two adjacent ones of the source signals O1~On should be opposite because of the unique configuration of the pixel units. In addition, the polarities of any source signal and a successive source signal which are transmitted to the same source line are also opposite. For example, in response to a first gate pulse, the source signals O1~On on the source lines have polarities (+,−,+,−, . . . +,−). In response to a second gate pulse, the source signals O1~On on the source lines have polarities (−,+,−,+, . . . −,+). In response to a third gate pulse, the source signals O1~On on the source lines have polarities (+,−,+,−, . . . +,−). The rest may be deduced by analogy.

Please refer to FIG. 2 again. The output buffering unit 116 comprises plural positive and negative voltage input operational amplifier sets 116a~116z. Each of the positive and negative voltage input operational amplifier sets 116a~116z issues two source signals with opposite polarities to the two adjacent source lines.

FIG. 3 is a schematic circuit diagram illustrating a conventional positive and negative voltage input operational amplifier set. As shown in FIG. 3, the positive and negative voltage input operational amplifier set 116a comprises a positive operational amplifier POP, a negative operational amplifier NOP, and a switching unit SW. The positive operational amplifier POP and the negative operational amplifier NOP are both rail-to-rail input operational amplifiers. That is, the voltages of the input signal and the output signals of the positive operational amplifier POP are both in the range between the voltage of the positive voltage source PAVDD and the voltage of a ground voltage source GND, and the voltages of the input signal and the output signals of the negative operational amplifier NOP are both in the range between the voltage of the ground voltage source GND and the voltage of a negative voltage source NAVDD.

The two power terminals of the positive operational amplifier POP are connected to the positive voltage source PAVDD and the ground voltage source GND, respectively. A first input signal IN1 is inputted into a positive input terminal of the positive operational amplifier POP. An output signal (a first output signal OUT1) of the positive operational amplifier POP is fed back to a negative input terminal of the positive operational amplifier POP. Consequently, the first output signal OUT1 is equal to the first input signal IN1. In addition, the input voltage of the first input signal IN1 is limited to be in the range between the voltage of the positive voltage source PAVDD and the voltage of a ground voltage source GND.

The two power terminals of the negative operational amplifier NOP are connected to the ground voltage source GND and the negative voltage source NAVDD, respectively. A second input signal IN2 is inputted into a positive input terminal of the negative operational amplifier NOP. An output signal (a second output signal OUT2) of the negative operational amplifier NOP is fed back to a negative input terminal of the negative operational amplifier NOP. Consequently, the second output signal OUT2 is equal to the second input signal IN2. In addition, the input voltage of the second input signal IN2 is limited to be in the range between the voltage of the ground voltage source GND and the voltage of a negative voltage source NAVDD.

The switching unit SW may be operated in two statuses. In a case that the switching unit SW is operated in the first status, by the switching unit SW, the first output signal OUT1 is switched to a positive-polarity first source signal O1 and the second output signal OUT2 is switched to a negative-polarity second source signal O2. In a case that the switching unit SW is operated in the second status, by the switching unit SW, the first output signal OUT1 is switched to a positive-polarity second source signal O2 and the second output signal OUT2 is switched to a negative-polarity first source signal O1. That is, when the switching unit SW is operated between the two statuses, the polarities of every two adjacent ones of the source signals O1~On are opposite. In addition, the polarities of any source signal and a successive source signal which are transmitted to the same source line are also opposite.

FIGS. 4A and 4B are schematic circuit diagrams respectively illustrating the positive operational amplifier and the negative operational amplifier of the conventional positive and negative voltage input operational amplifier set.

As shown in FIG. 4A, the positive operational amplifier POP comprises a first differential pair including a first PMOS transistor MP1 and a second PMOS transistor MP2, a first current source I1, a first active region controlling circuit 402, a second differential pair including a first NMOS transistor MN1 and a second NMOS transistor MN2, a second current source I2, a second active region controlling circuit 404, and an output stage circuit 406.

The gate terminal of the first PMOS transistor MP1 is the positive input terminal (+) of the positive operational amplifier POP for receiving the first input signal IN1. The gate terminal of the second PMOS transistor MP2 is the negative input terminal (−) of the positive operational amplifier POP.

The first current source I1 is connected between the source terminal of the first PMOS transistor MP1 and the positive voltage source PAVDD. In addition, the source terminal of the first PMOS transistor MP1 and the source terminal of the second PMOS transistor MP2 are connected with each other. A first terminal of the first active region controlling circuit 402 is connected to the drain terminal of the first PMOS transistor MP1. A second terminal of the first active region controlling circuit 402 is connected to the drain terminal of the second PMOS transistor MP2. A third end of the first active region controlling circuit 402 is connected to the ground voltage source GND. The first current source I1 and the first active region controlling circuit 402 are used for controlling the first PMOS transistor MP1 and the second PMOS transistor MP2 to be operated at the active region.

The gate terminal of the first NMOS transistor MN1 is connected to the gate terminal of the first PMOS transistor MP1. The gate terminal of the second NMOS transistor MN2 is connected to the gate terminal of the second PMOS transistor MP2. The second current source I2 is connected between the source terminal of the first NMOS transistor MN1 and the ground voltage source GND. In addition, the source terminal of the first NMOS transistor MN1 and the source terminal of the second NMOS transistor MN2 are connected with each other. A first terminal of the second active region controlling circuit 404 is connected to the drain terminal of the first NMOS transistor MN1. A second terminal of the second active region controlling circuit 404 is connected to the drain terminal of the second NMOS transistor MN2. A third end of the second active region controlling circuit 404 is connected to the positive voltage source PAVDD. The second current source I2 and the second active region controlling circuit 404 are used for controlling the first NMOS transistor MN1 and the second NMOS transistor MN2 to be operated at the active region.

The two power terminals of the output stage circuit 406 are connected between the positive voltage source PAVDD and the ground voltage source GND. A first terminal of the output stage circuit 406 is connected to the drain terminal of the second NMOS transistor MN2. A second terminal of the output stage circuit 406 is connected to the drain terminal of the first PMOS transistor MP1. The output terminal of the output stage circuit 406 is connected to the gate terminal of the second PMOS transistor MP2 for generating the first output signal OUT1.

Expect for the following items, the configurations of the negative operational amplifier NOP of FIG. 4B are similar to those of the positive operational amplifier POP of FIG. 4A. For example, the second input signal IN2 is received by the positive terminal (+) of the negative operational amplifier NOP, the output terminal of the output stage circuit 406 generates the second output signal OUT2, and the two power terminals of the output stage circuit 406 are respectively connected to the ground voltage source GND and the negative voltage source NAVDD.

As described in FIGS. 4A and 4B, an operational amplifier has two differential pairs for achieving the function of rail-to-rail. In addition, a current source and an active region controlling circuit are needed for controlling a corresponding differential pair to be operated at the active region. In other words, the conventional positive and negative voltage input operational amplifier set needs four differential pairs, four current sources, and four active region controlling circuits totally. Under this circumstance, the layout area is increased, the static current is too high, and the power consumption is increased.

SUMMARY OF THE INVENTION

The present invention provides a positive and negative voltage input operational amplifier set with a reduced layout area and a lowered static current.

A first embodiment of the present invention provides a positive and negative voltage input operational amplifier of a source driver for receiving a first power voltage, a second power voltage and a third power voltage. The first power voltage is higher than the second power voltage. The second power voltage is higher than the third power voltage. The positive and negative voltage input operational amplifier includes a positive operational amplifier, a negative operational amplifier, and a switching unit. The positive operational amplifier is used for receiving a first input signal and generating a first output signal. Each of the first input signal and the first output signal is operated in a voltage range between the first power voltage and the second power voltage. The positive operational amplifier includes a first NMOS transistor, a second NMOS transistor, a third NMOS transistor, a first active region controlling circuit, a first current source, and first output stage circuit. The first NMOS transistor has a first gate terminal served as a positive input terminal of the positive operational amplifier for receiving the first input signal. The second NMOS transistor has a second gate terminal served as a negative input terminal of the positive operational amplifier. A first source terminal of the first NMOS transistor and a second source terminal of the second NMOS transistor are connected to a first node. The third NMOS transistor has a third drain terminal connected to the first node, a third gate terminal receiving the second power voltage, and a third source terminal connected to a second node. The first active region controlling circuit has a first terminal connected to a first drain terminal of the first NMOS transistor, a second terminal connected to a second drain terminal of the second NMOS transistor, and a third terminal connected to the first power voltage. The first current source is connected between the second node and the third power voltage. The first NMOS transistor and the second NMOS transistor are controlled be operated at an active region by the first current source and the first active region controlling circuit. The first output stage circuit is used for generating the first output signal. The first output stage circuit has a first power terminal connected to the first power voltage, a second power terminal connected to the second power voltage, an input terminal connected to the second drain terminal, and an output terminal connected to the second gate terminal. The negative operational amplifier is used for receiving a second input signal and generating a second output signal. Each of the second input signal and the second output signal is operated in a voltage range between the second power voltage and the third power voltage. The switching unit is selectively operated in a first status or a second status. When the switching unit is operated in the first status, the first output signal is switched to a first source signal and the second output signal is switched to a second source signal. When the switching unit is operated in the second status, the first output signal is switched to the second source signal and the second output signal is switched to the first source signal. Consequently, the first source signal and the second source signal are controlled to have different polarities.

A second embodiment of the present invention provides a positive and negative voltage input operational amplifier of a source driver for receiving a first power voltage, a second power voltage and a third power voltage. The first power voltage is higher than the second power voltage. The second power voltage is higher than the third power voltage. The positive and negative voltage input operational amplifier includes a positive operational amplifier, a negative operational amplifier, and a switching unit. The positive operational amplifier is used for receiving a first input signal and generating a first output signal. Each of the first input signal and the first output signal is operated in a voltage range between the first power voltage and the second power voltage. The negative operational amplifier is used for receiving a second input signal and generating a second output signal. Each of the second input signal and the second output signal is operated in a voltage range between the second power voltage and the third power voltage. The negative operational amplifier includes a first PMOS transistor, a second PMOS transistor, a third PMOS transistor, a first active region controlling circuit, a first current source, and a first output stage circuit. The first PMOS transistor has a first gate terminal served as a positive input terminal of the negative operational amplifier for receiving the second input signal. The second PMOS transistor has a second gate terminal served as a negative input terminal of the negative operational amplifier. A first source terminal of the first PMOS transistor and a second source terminal of the second PMOS transistor are connected to a first node. The third PMOS transistor has a third drain terminal connected to the first node, a third gate terminal receiving the second power voltage, and a third source terminal connected to a second node. The first active region controlling circuit has a first terminal connected to a first drain terminal of the first PMOS transistor, a second terminal connected to a second drain terminal of the second PMOS transistor, and a third terminal connected to the third power voltage. The first current source is connected between the second node and the first power voltage. The first PMOS transistor and the second PMOS transistor are controlled to be operated at an active region by the first current source and the first active region controlling circuit. The first output stage circuit is used for generating the second output signal, wherein the first output stage circuit has a first power terminal connected to the second power voltage, a second power terminal connected to the third power voltage, an input terminal connected to the first drain terminal, and an output terminal connected to the second gate terminal. The switching unit is selectively operated in a first status or a second status. When the switching unit is operated in the first status, the first output signal is switched to a first source signal and the second output signal is switched to a second source signal. When the switching unit is operated in the second status, the first output signal is switched to the second source signal and the second output signal is switched to the first source signal. Consequently, the first source signal and the second source signal are controlled have different polarities.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 1:
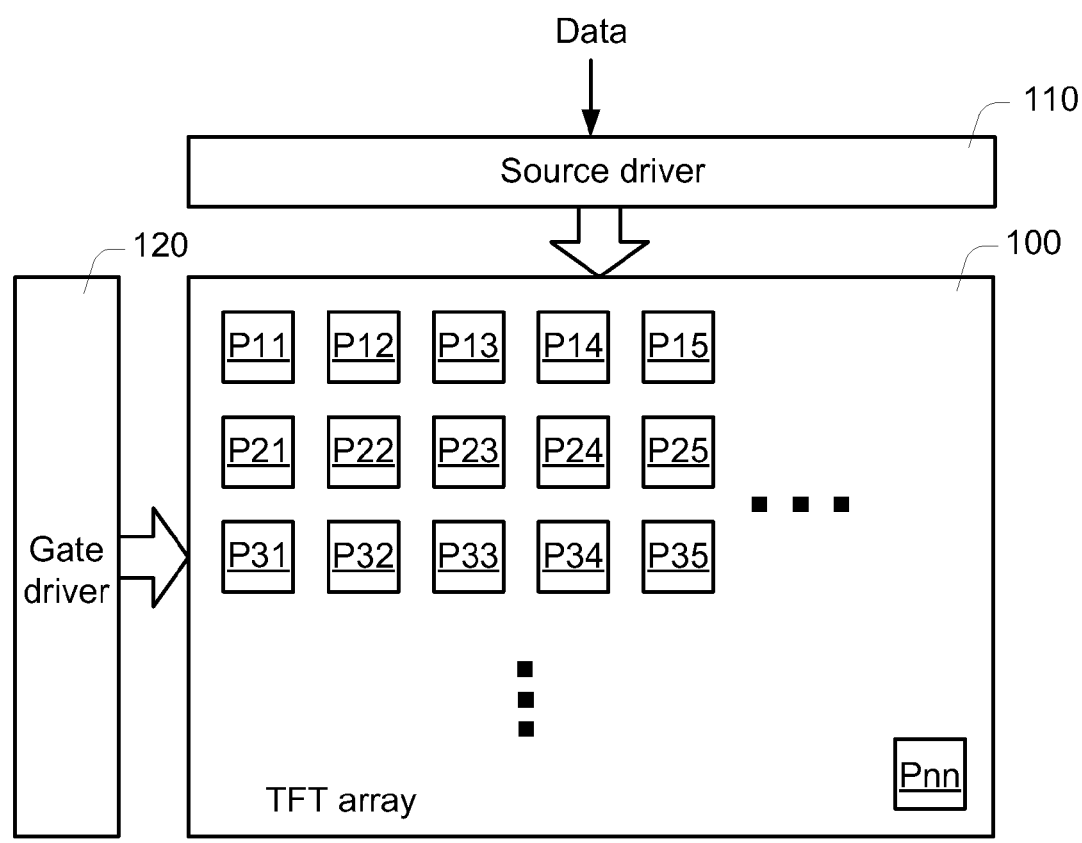
FIG. 1 (prior art) schematically illustrates the architecture of a conventional LCD panel.
Figure 2:
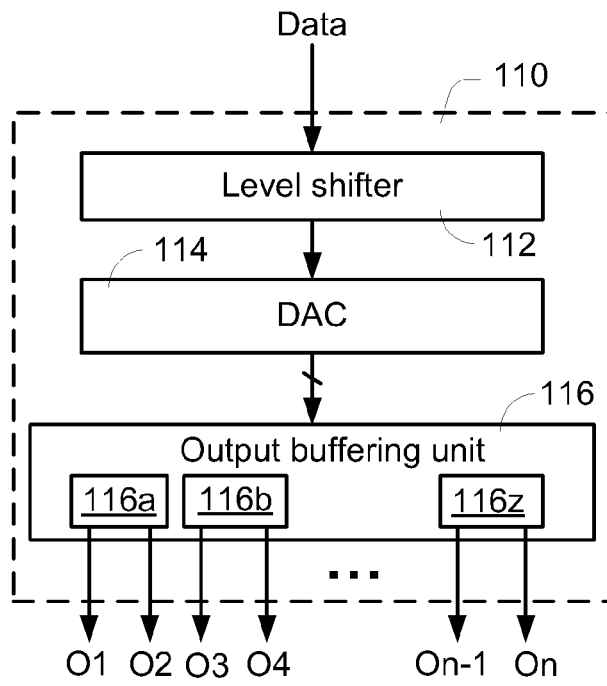
FIG. 2 (prior art) is a schematic circuit block diagram illustrating the source driver of the conventional LCD panel.
Figure 3:
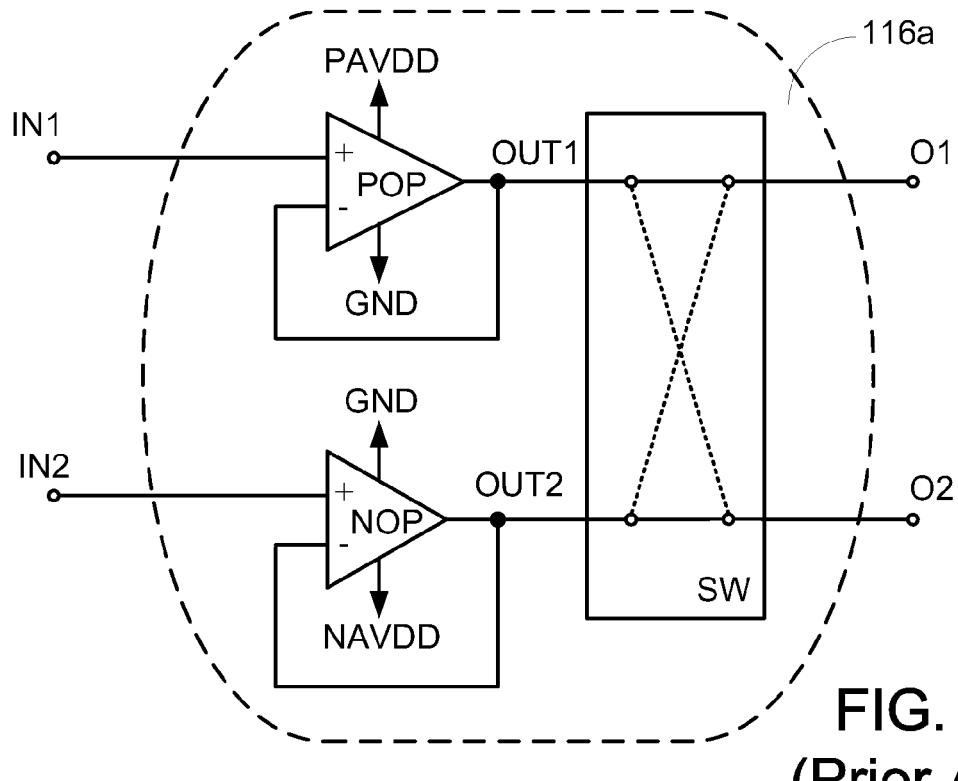
FIG. 3 (prior art) is a schematic circuit diagram illustrating a conventional positive and negative voltage input operational amplifier set.
Figure 4A:
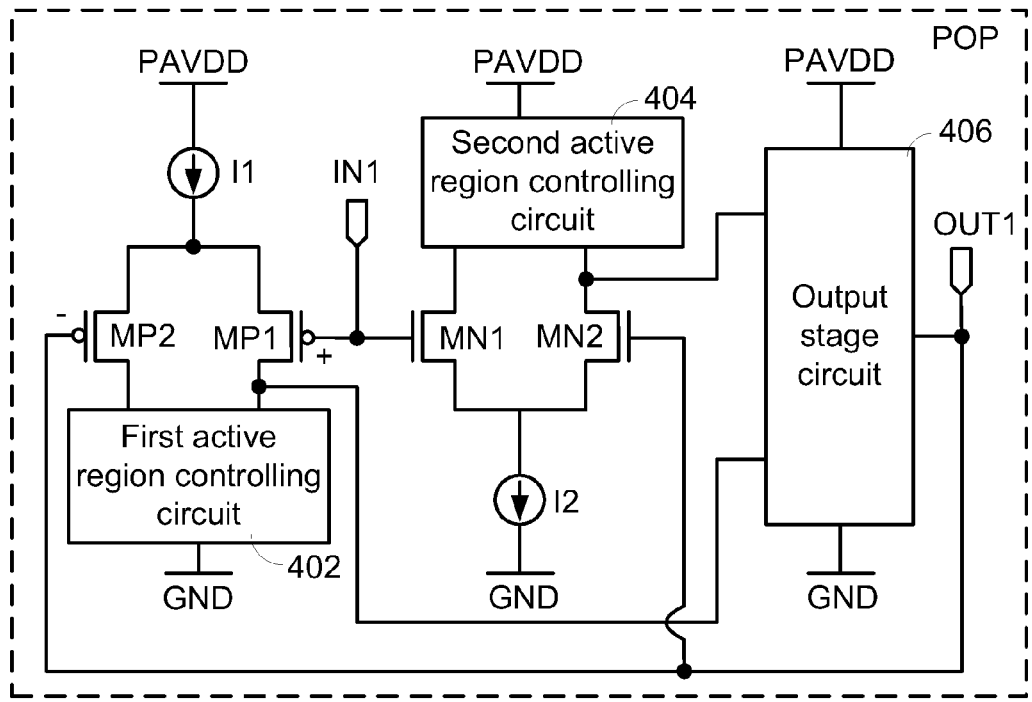
FIGS. 4A and 4B (prior art) are schematic circuit diagrams respectively illustrating the positive operational amplifier and the negative operational amplifier of the conventional positive and negative voltage input operational amplifier set.
Figure 4B:
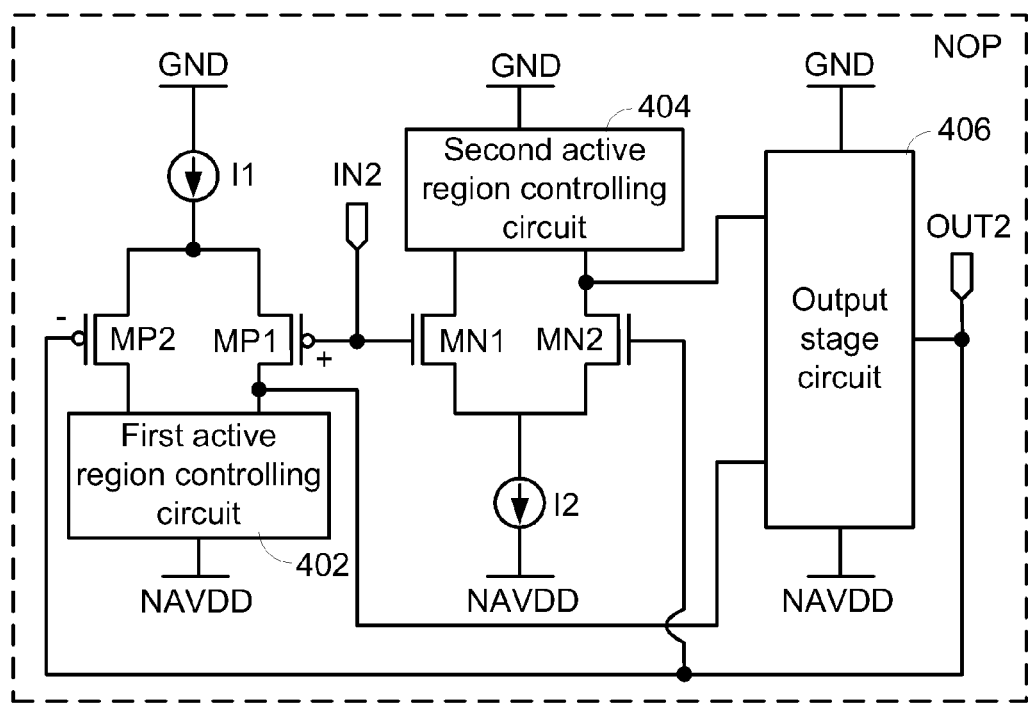

As previously described in FIG. 3, the voltage sources of the positive and negative voltage input operational amplifier set include a positive voltage source PAVDD, a ground voltage source GND, and a negative voltage source NAVDD. The present invention provides a positive and negative voltage input operational amplifier set. The positive and negative voltage input operational amplifier set comprises a positive operational amplifier POP, a negative operational amplifier NOP, and a switching unit. In accordance with a feature of the present invention, the configurations of the positive operational amplifier POP and the negative operational amplifier NOP are modified, so that the layout area is reduced and the static current is lowered.

Figure 5A:
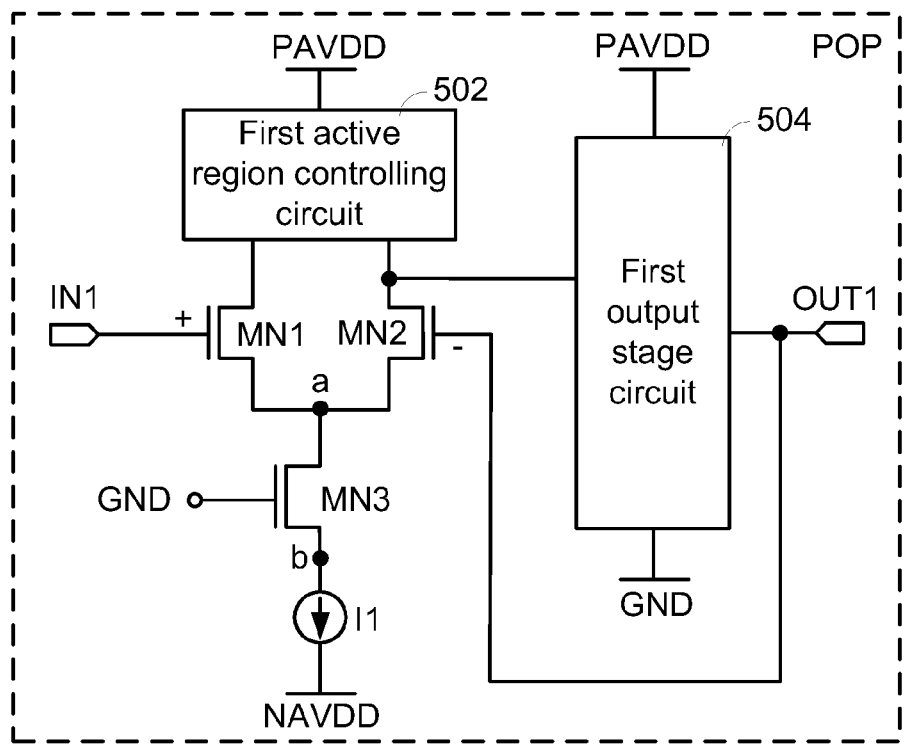
FIGS. 5A and 5B are schematic circuit diagrams respectively illustrating the positive operational amplifier and the negative operational amplifier of a positive and negative voltage input operational amplifier set according to an embodiment of the present invention.
Figure 5B:
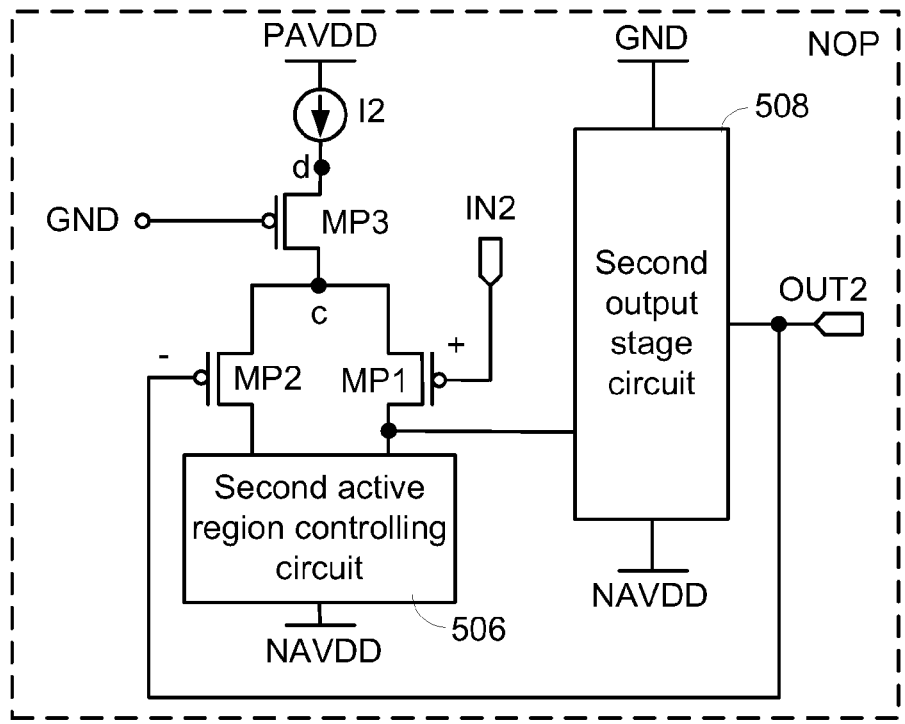

FIGS. 5A and 5B are schematic circuit diagrams respectively illustrating the positive operational amplifier and the negative operational amplifier of a positive and negative voltage input operational amplifier set according to an embodiment of the present invention.

As shown in FIG. 5A, the positive operational amplifier POP comprises a first current source I1, a first active region controlling circuit 502, a first differential pair including a first NMOS transistor NM1 and a second NMOS transistor NM2, a third NMOS transistor NM3, and a first output stage circuit 504.

The gate terminal of the first NMOS transistor NM1 is the positive input terminal (+) of the positive operational amplifier POP for receiving the first input signal IN1. The gate terminal of the second NMOS transistor NM2 is the negative input terminal (−) of the positive operational amplifier POP. The source terminal of the first NMOS transistor NM1 and the source terminal of the second NMOS transistor NM2 are connected to a node "a". The drain terminal of the third NMOS transistor NM3 is also connected to the node "a". The gate terminal of the third NMOS transistor NM3 is connected to the ground voltage source GND. The source terminal of the third NMOS transistor NM3 is connected to a node "b". The first current source I1 is connected between the node "b" and the negative voltage source NAVDD. A first terminal of the first active region controlling circuit 502 is connected to the drain terminal of the first NMOS transistor NM1. A second terminal of the first active region controlling circuit 502 is connected to the drain terminal of the second NMOS transistor NM2. A third terminal of the first active region controlling circuit 502 is connected to the positive voltage source PAVDD. The first current source I1 and the first active region controlling circuit 502 are used for controlling the first NMOS transistor MN1 and the second NMOS transistor MN2 to be operated at the active region.

The two power terminals of the first output stage circuit 504 are connected between the positive voltage source PAVDD and the ground voltage source GND. The input terminal of the first output stage circuit 504 is connected to the drain terminal of the second NMOS transistor MN2. The output terminal of the first output stage circuit 504 is connected to the gate terminal of the second NMOS transistor MN2 for generating the first output signal OUT1. During normal operations of the positive operational amplifier POP, the first input signal IN1, the signal inputted into the input terminal of the first output stage circuit 504 and the first output signal OUT1 are identical.

As shown in FIG. 5B, the negative operational amplifier NOP comprises a second current source I2, a second active region controlling circuit 506, a second differential pair including a first PMOS transistor MP1 and a second PMOS transistor MP2, a third PMOS transistor MP3, and a second output stage circuit 508.

The gate terminal of the first PMOS transistor MP1 is the positive input terminal (+) of the negative operational amplifier NOP for receiving the second input signal IN2. The gate terminal of the second PMOS transistor MP2 is the negative input terminal (−) of the negative operational amplifier NOP. The source terminal of the first PMOS transistor MP1 and the source terminal of the second PMOS transistor MP2 are connected to a node "c". The drain terminal of the third PMOS transistor MP3 is also connected to the node "c". The gate terminal of the third PMOS transistor MP3 is connected to the ground voltage source GND. The source terminal of the third PMOS transistor MP3 is connected to a node "d". The second current source I2 is connected between the node "d" and the positive voltage source PAVDD. A first terminal of the second active region controlling circuit 506 is connected to the drain terminal of the first PMOS transistor MP1. A second terminal of the second active region controlling circuit 506 is connected to the drain terminal of the second PMOS transistor MP2. A third terminal of the second active region controlling circuit 506 is connected to the negative voltage source NAVDD. The second current source I2 and the second active region controlling circuit 506 are used for controlling the first PMOS transistor MP1 and the second PMOS transistor MP2 to be operated at the active region.

The two power terminals of the second output stage circuit 508 are connected between the ground voltage source GND and the negative voltage source NAVDD. The input terminal of the second output stage circuit 508 is connected to the drain terminal of the first PMOS transistor MP1. The output terminal of the second output stage circuit 508 is connected to the gate terminal of the second PMOS transistor MP2 for generating the second output signal OUT2. During normal operations of the negative operational amplifier NOP, the second input signal IN2, the signal inputted into the input terminal of the second output stage circuit 508 and the second output signal OUT2 are identical. In an embodiment, the first output stage circuit 504 and the second output stage circuit 508 are buffers.

Moreover, the switching unit of the present invention has functions similar to the switch unit of FIG. 3. The switching unit may be operated in two statuses. In a case that the switching unit is operated in the first status, by the switching unit, the first output signal OUT1 is switched to a positive-polarity first source signal O1 and the second output signal OUT2 is switched to a negative-polarity second source signal O2. In a case that the switching unit is operated in the second status, by the switching unit, the first output signal OUT1 is switched to a positive-polarity second source signal O2 and the second output signal OUT2 is switched to a negative-polarity first source signal O1.

As described in FIGS. 5A and 5B, the positive and negative voltage input operational amplifier set of the present invention only needs two differential pairs, two current sources, and two active region controlling circuits totally. In comparison with the conventional positive and negative voltage input operational amplifier set, the positive and negative voltage input operational amplifier set has a reduced layout area. Moreover, since the number of the current sources is reduced, the static current is lowered and the power consumption is reduced. Hereinafter, the operating principles of the positive operational amplifier POP and the negative operational amplifier NOP will be illustrated in more details.

In an embodiment, the voltage provided by the positive voltage source PAVDD is +5V, the voltage provided by the ground voltage source GND is 0V, and the voltage provided by the negative voltage source NAVDD is −5V. Moreover, each of the transistors of the positive operational amplifier POP and the negative operational amplifier NOP can withstand a voltage of 5V.

If the first input signal IN1 inputted into the positive operational amplifier POP is 0V, the first output signal OUT1 is also 0V. Consequently, the voltage at the node "a" can be calculated as: $Vng1 - Vngs1 = Vng2 - Vngs2 = 0V - Vthn$, wherein $Vng1$ is the gate voltage of the first NMOS transistor MN1, $Vng2$ is the gate voltage of the second NMOS transistor MN2, $Vngs1$ is the gate-source voltage of the first NMOS transistor MN1, $Vngs2$ is the gate-source voltage of the second NMOS transistor MN2, and $Vthn$ is the positive threshold voltage of the NMOS transistor. The voltage at the node "b" can be calculated as: $Vng3 - Vgs3 = 0V - Vthn$, wherein $Vng3$ is the gate voltage of the third NMOS transistor MN3, and $Vngs3$ is the gate-source voltage of the third NMOS transistor MN3. Obviously, the voltage at the node "a" is substantially equal to the voltage at the node "b". Consequently, the third NMOS transistor MN3 can withstand a voltage of 5V.

Whereas, if the first input signal IN1 inputted into the positive operational amplifier POP is +5V, the first output signal OUT1 is also +5V. Consequently, the voltage at the node "a" may be calculated as: $Vng1 - Vngs1 = Vng2 - Vngs2 = 5V - Vthn$. The voltage at the node "b" may be calculated as: $Vng3 - Vngs3 = 0V - Vthn$. Obviously, the voltage at the node "a" and the voltage at the node "b" are about +5V. Consequently, the third NMOS transistor MN3 can withstand a voltage of 5V.

From the above discussions, the operations of the positive operational amplifier POP are normal when the first input signal IN1 is operated in the voltage range between 0V and +5V.

If the second input signal IN2 inputted into the negative operational amplifier NOP is −5V, the second output signal OUT2 is also −5V. Consequently, the voltage at the node "c" can be calculated as: $Vpg1 - Vpgs1 = Vpg2 - Vpgs2 = -5V - Vthp$, wherein $Vpg1$ is the gate voltage of the first PMOS transistor MP1, $Vpg2$ is the gate voltage of the second PMOS transistor MP2, $Vpgs1$ is the gate-source voltage of the first PMOS transistor MP1, $Vpgs2$ is the gate-source voltage of the second PMOS transistor MP2, and $Vthp$ is the negative threshold voltage of the PMOS transistor. The voltage at the node "d" can be calculated as: $Vpg3 - Vpgs3 = 0V - Vthp$, wherein $Vpg3$ is the gate voltage of the third PMOS transistor MP3, and $Vpgs3$ is the gate-source voltage of the of the third PMOS transistor MP3. Obviously, the voltage at the node "d" and the voltage at the node "c" are about +5V. Consequently, the third PMOS transistor MP3 can withstand a voltage of 5V.

If the second input signal IN2 inputted into the negative operational amplifier NOP is 0V, the second output signal OUT2 is also 0V. Consequently, the voltage at the node "c" can be calculated as: Vpg1−Vpgs1=Vpg2−Vpgs2=0V−Vthp. The voltage at the node "d" may be calculated as: Vpg3−Vpgs3=0V−Vthn. Obviously, the voltage at the node "d" is substantially equal to the voltage at the node "c". Consequently, the third PMOS transistor MP3 can withstand a voltage of 5V.

From the above discussions, the operations of the negative operational amplifier NOP are normal when the second input signal IN2 is operated in the voltage range between −5V and 0V.

From the above description, the present invention provides a positive and negative voltage input operational amplifier. Each of the positive operational amplifier POP and the negative operational amplifier NOP has a reduced layout area and a lowered static current, so that the power consumption is effectively reduced.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A positive and negative voltage input operational amplifier of a source driver, for receiving a first power voltage, a second power voltage and a third power voltage, wherein the first power voltage is higher than the second power voltage, and the second power voltage is higher than the third power voltage, the positive and negative voltage input operational amplifier comprising:
   a positive operational amplifier, for receiving a first input signal and generating a first output signal, wherein the first input signal and the first output signal are respectively operated between the first power voltage and the second power voltage, wherein the positive operational amplifier further comprises:
   a first NMOS transistor, having a first gate terminal served as a positive input terminal of the positive operational amplifier for receiving the first input signal;
   a second NMOS transistor, having a second gate terminal served as a negative input terminal of the positive operational amplifier, wherein a first source terminal of the first NMOS transistor and a second source terminal of the second NMOS transistor are connected to a first node;
   a third NMOS transistor, having a third drain terminal connected to the first node, a third gate terminal receiving the second power voltage, and a third source terminal connected to a second node;
   a first active region controlling circuit, having a first terminal connected to a first drain terminal of the first NMOS transistor, a second terminal connected to a second drain terminal of the second NMOS transistor, and a third terminal connected to the first power voltage;
   a first current source, connected between the second node and the third power voltage, wherein the first NMOS transistor and the second NMOS transistor are controlled to be operated at an active region by the first current source and the first active region controlling circuit; and
   a first output stage circuit, for generating the first output signal, wherein the first output stage circuit has a first power terminal connected to the first power voltage, a second power terminal connected to the second power voltage, an input terminal connected to the second drain terminal, and an output terminal connected to the second gate terminal;
   a negative operational amplifier, for receiving a second input signal and generating a second output signal, wherein the second input signal and the second output signal are respectively operated between the second power voltage and the third power voltage; and
   a switching unit selectively operated in a first status or a second status in order to control polarities of a first source signal and a second source signal, wherein when the switching unit is operated in the first status, the first output signal is switched to the first source signal and the second output signal is switched to the second source signal, otherwise when the switching unit is operated in the second status, the first output signal is switched to the second source signal and the second output signal is switched to the first source signal.

2. The positive and negative voltage input operational amplifier as claimed in claim 1, wherein the negative operational amplifier further comprises:
   a first PMOS transistor, having a fourth gate terminal served as a positive input terminal of the negative operational amplifier, for receiving the second input signal;
   a second PMOS transistor, having a fifth gate terminal served as a negative input terminal of the negative operational amplifier, wherein a fourth source terminal of the first PMOS transistor and a fifth source terminal of the second PMOS transistor are connected to a third node;
   a third PMOS transistor, having a sixth drain terminal connected to the third node, a sixth gate terminal receiving the second power voltage, and a sixth source terminal connected to a fourth node;
   a second active region controlling circuit, having a first terminal connected to a fourth drain terminal of the first PMOS transistor, a second terminal connected to a fifth drain terminal of the second PMOS transistor, and a third terminal connected to the third power voltage;
   a second current source, connected between the fourth node and the first power voltage, wherein the first PMOS transistor and the second PMOS transistor are controlled to be operated at the active region by the second current source and the second active region controlling circuit; and
   a second output stage circuit, for generating the second output signal, wherein the second output stage circuit has a third power terminal connected to the second power voltage, a fourth power terminal connected to the third power voltage, an input terminal connected to the fourth drain terminal, and an output terminal connected to the fifth gate terminal.

3. The positive and negative voltage input operational amplifier as claimed in claim 2, wherein the first output stage circuit and the second output stage circuit are buffers.

4. The positive and negative voltage input operational amplifier as claimed in claim 2, wherein the first power voltage is 5V, the second power voltage is 0V, and the third power voltage is −5V.

5. The positive and negative voltage input operational amplifier as claimed in claim 2, wherein the first power voltage is provided by a positive power voltage source, the second power voltage is provided by a ground voltage source, and the third power voltage is provided by a negative power voltage source.

6. The positive and negative voltage input operational amplifier as claimed in claim 2, wherein the positive operational amplifier and the negative operational amplifier are rail-to-rail input operational amplifiers.

7. A positive and negative voltage input operational amplifier of a source driver, for receiving a first power voltage, a second power voltage and a third power voltage, wherein the first power voltage is higher than the second power voltage, and the second power voltage is higher than the third power voltage, the positive and negative voltage input operational amplifier comprising:
- a positive operational amplifier, for receiving a first input signal and generating a first output signal, wherein each of the first input signal and the first output signal is operated in a voltage range between the first power voltage and the second power voltage;
- a negative operational amplifier, for receiving a second input signal and generating a second output signal, wherein each of the second input signal and the second output signal are respectively operated between the second power voltage and the third power voltage, wherein the negative operational amplifier further comprises:
  - a first PMOS transistor, having a first gate terminal served as a positive input terminal of the negative operational amplifier for receiving the second input signal;
  - a second PMOS transistor, having a second gate terminal served as a negative input terminal of the negative operational amplifier, wherein a first source terminal of the first PMOS transistor and a second source terminal of the second PMOS transistor are connected to a first node;
  - a third PMOS transistor, having a third drain terminal connected to the first node, a third gate terminal receiving the second power voltage, and a third source terminal connected to a second node;
  - a first active region controlling circuit, having a first terminal connected to a first drain terminal of the first PMOS transistor, a second terminal connected to a second drain terminal of the second PMOS transistor, and a third terminal connected to the third power voltage;
  - a first current source, connected between the second node and the first power voltage, wherein the first PMOS transistor and the second PMOS transistor are controlled to be operated at an active region by the first current source and the first active region controlling circuit; and
  - a first output stage circuit, for generating the second output signal, wherein the first output stage circuit has a first power terminal connected to the second power voltage, a second power terminal connected to the third power voltage, an input terminal connected to the first drain terminal, and an output terminal connected to the second gate terminal; and
- a switching unit selectively operated in a first status or a second status in order to control polarities of a first source signal and a second source signal, wherein when the switching unit is operated in the first status, the first output signal is switched to the first source signal and the second output signal is switched to the second source signal, otherwise when the switching unit is operated in the second status, the first output signal is switched to the second source signal and the second output signal is switched to the first source signal.

8. The positive and negative voltage input operational amplifier as claimed in claim 7, wherein the first output stage circuit and the second output stage circuit are buffers.

9. The positive and negative voltage input operational amplifier as claimed in claim 7, wherein the first power voltage is 5V, the second power voltage is 0V, and the third power voltage is −5V.

10. The positive and negative voltage input operational amplifier as claimed in claim 7, wherein the first power voltage is provided by a positive power voltage source, the second power voltage is provided by a ground voltage source, and the third power voltage is provided by a negative power voltage source.

11. The positive and negative voltage input operational amplifier as claimed in claim 7, wherein the positive operational amplifier and the negative operational amplifier are rail-to-rail input operational amplifiers.

* * * * *